(12) United States Patent
Wolf et al.

(10) Patent No.: US 8,796,998 B2
(45) Date of Patent: Aug. 5, 2014

(54) BIDIRECTIONAL CURRENT SENSE

(75) Inventors: Christian Wolf, Gauting (DE); Stefano Scaldaferri, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 565 days.

(21) Appl. No.: 13/068,205

(22) Filed: May 5, 2011

(65) Prior Publication Data

US 2012/0268075 A1   Oct. 25, 2012

(30) Foreign Application Priority Data

Apr. 19, 2011 (EP) ..................................... 11392002

(51) Int. Cl.
 *H02J 7/16* (2006.01)
 *G01R 31/08* (2006.01)
 *G05F 1/00* (2006.01)

(52) U.S. Cl.
 USPC ............................ 320/152; 324/522; 323/282

(58) Field of Classification Search
 USPC .......... 324/522; 320/161, 162, 165, 152, 157, 320/158, 159, 163, 164
 See application file for complete search history.

(56) References Cited

U.S. PATENT DOCUMENTS

| 5,287,055 | A | 2/1994 | Cini et al. |
| 5,495,155 | A | 2/1996 | Juzswik et al. |
| 5,867,014 | A | 2/1999 | Wrathall et al. |
| 6,100,676 | A | 8/2000 | Burstein et al. |
| 6,522,104 | B1 * | 2/2003 | Drori ............................ 320/149 |
| 7,009,403 | B2 * | 3/2006 | Graf et al. ...................... 324/522 |
| 7,034,542 | B2 * | 4/2006 | Peterson ........................ 324/522 |
| 7,126,354 | B2 * | 10/2006 | Deboy et al. ................... 324/713 |
| 7,187,180 | B2 * | 3/2007 | Childers ........................ 324/522 |
| 7,202,694 | B2 * | 4/2007 | Eberlein ........................ 324/120 |
| 7,327,149 | B2 * | 2/2008 | Chapuis ........................ 324/522 |
| 7,723,975 | B2 * | 5/2010 | Fujii ........................... 324/76.11 |
| 7,868,622 | B2 * | 1/2011 | Utsunomiya ................. 324/522 |
| 8,358,107 | B2 * | 1/2013 | Nguyen ........................ 320/128 |

(Continued)

FOREIGN PATENT DOCUMENTS

| DE | 10240914 | 3/2004 |
| EP | 0438363 | 7/1991 |
| EP | 0 693 749 | 1/1996 |
| FR | 2853468 | 10/2004 |

OTHER PUBLICATIONS

European Search Report—11392002.9-2216, Mail Date—Oct. 14, 2011, Dialog Semiconductor GmbH.

(Continued)

*Primary Examiner* — Richard V Muralidar
*Assistant Examiner* — Michael Dibenedetto
(74) *Attorney, Agent, or Firm* — Saile Ackerman LLC; Stephen B. Ackerman

(57) ABSTRACT

Method and circuits for sensing a bidirectional current without requiring an external sense resistor are disclosed. In a preferred embodiment the invention is applied for fuel gauging of one or more batteries and comprises a charger/active diode, which can source current into the battery and sink current from the battery to supply a mobile electronic device. The invention can be applied to any other application requiring sensing of bidirectional currents. A regulated cascode forces a voltage drop over a power transistor and a sense transistor to be the same. A feedback current is measured by an ADC. The integration of these current measurements over time is equal to the actual charge of the battery.

24 Claims, 3 Drawing Sheets

Regulated cascade to equalize
drain-source voltage of power-MOS
and sense MOS transistor

(56) References Cited

U.S. PATENT DOCUMENTS

| | | |
|---|---|---|
| 2006/0028192 A1 | 2/2006 | Ryu et al. |
| 2006/0255783 A1* | 11/2006 | Chapuis .................. 323/282 |
| 2007/0070664 A1* | 3/2007 | Chen ........................ 363/95 |
| 2008/0197801 A1 | 8/2008 | Manor et al. |
| 2008/0204958 A1* | 8/2008 | Shearon et al. ........... 361/93.9 |
| 2009/0086517 A1 | 4/2009 | Wei et al. |
| 2011/0068762 A1* | 3/2011 | Nishida ..................... 323/282 |

OTHER PUBLICATIONS

"A Wireless Power Interface for Rechargeable Battery Operated Medical Implants," by Pengfei Li et al., IEEE Transactions on Circuits and Systems—II: Express Briefs, vol. 54, No. 10, Oct. 2007, pp. 912-916.

* cited by examiner

BIDIRECTIONAL CURRENT SENSE

BACKGROUND OF THE INVENTION (1) Field of the Invention

This invention relates generally to current sensing and relates more specifically to fully integrated bidirectional current sense as e.g. currents into and out of a battery.

(2) Description of the Prior Art

Sensing bidirectionally a battery current into and out of a battery by an integrated circuit usually requires an external resistor, which transforms the current into a voltage that then can be measured with a precision analog-to-digital converter (ADC). Since this resistor is placed in the high current path it has to be of low value because of the associated voltage drop. The value of this resistor is usually in the order of 100 m Ohms or less.

This leads to very small voltages, which have to be sensed. These small voltages put tough requirements on the specifications for the ADC and its input amplifiers in terms of noise, offset and dynamic range. These and the additional voltage drop (especially at high currents) are the main disadvantages of state-of-art implementations.

Therefore it is a challenge to designers of circuits to sense currents without using a sense resistor.

Solutions dealing with sensing of currents are described in the following patents:

U.S. patent (U.S. Pat. No. 7,327,149 to Chapuis) discloses a current sensing circuit comprising a power device adapted to conduct a bidirectional current between first and second terminals thereof, first and second sensing devices operatively coupled to the power device, a sense amplifier providing first and second voltages to the first and second sensing devices, and a gate drive device providing activating signals to the power switching device and the first and second sensing devices. The first and second sensing devices each has an active area that is substantially identical and significantly smaller than a corresponding active area of the power-switching device. The sense amplifier measures the voltage of the first sensing device and maintains the voltage on the second sensing device at the same level as the first sensing device by injecting an additional current into the second sensing device. The sense amplifier further provides an output signal proportional to the bidirectional current. The first and second sensing devices have k times higher resistance than a corresponding resistance of the power device when in an active state.

U.S. patent (U.S. Pat. No. 5,495,155 to Juzswik et al.) proposes an improved current sensing circuit provided in, or for use with, a power delivery circuit having a current controlling device of the type, which includes auxiliary current sensing terminals. The current sensing circuit is particularly useful in conjunction with a respective current sensing power MOSFET located in the "high side" of a switching circuit, such as an H-bridge switch for a bidirectional load. The current sensing circuit has two branches connected to the current sensing MOSFET and to a reference potential and constructed to provide an output voltage signal representative of the main current through the current sensing MOSFET. The first branch includes at least two transistors and a resistor serially connected between a current sense terminal of the MOSFET and a reference potential. The second branch also includes at least two serially connected transistors connected between a terminal of the MOSFET and the reference potential. The transistors are cross connected between branches and provide an inverted current mirror and a current mirror. Fifth and sixth transistors may also be included as part of the current sensing circuit.

U.S. Patent Application Publication (US 2008/0197801 to Manor et al.) proposes a bidirectional battery charge control system for a portable electronic device, which uses a rechargeable main battery. The system enables the connection of an auxiliary battery to the device for inputting additional current to the device. Control of the current flow into and out of the auxiliary battery is performed by a bidirectional charger. The auxiliary battery can contain one or more readily available primary or secondary cells, and the bidirectional charger is such that an external charger connected to the device, generally used to charge the main rechargeable battery of the device, can also recharge a secondary cell or cells in the auxiliary battery, if such are installed. The use of such an auxiliary battery enables the main battery to be hard-wired into the device.

SUMMARY OF THE INVENTION

A principal object of the present invention is to achieve methods and circuits for sensing bidirectional currents without requiring an external resistor.

A further object of the invention is to achieve methods and circuits for sensing bidirectional currents without requiring an external resistor in order to perform fuel gauging of batteries.

A further object of the invention is to use a control loop with a fraction of the charge/discharge current as a feedback signal.

In accordance with the objects of this invention a method for sensing a bidirectional current without requiring an external sense resistor has been achieved. The method invented comprises, firstly, the following steps: 1) providing of a power transistor, a first sense transistor, a second sense transistor, a first control circuit, a second control circuit, and an analog-to-digital converter (ADC), (2) mirroring to the first sense transistor a small fraction of a current to be sensed flowing in a first direction through the power transistor, and (3) regulating a voltage drop of the current flowing in the first direction over the power transistor and over the first sense transistor to be the same by the first control circuit. The following steps are: (4) measuring a feedback current of the voltage drop regulation of the current flowing in the first direction by the analog-to digital converter, (5) mirroring to the second sense transistor a small fraction of a current to be sensed flowing in a second direction through the power transistor, (6) regulating a voltage drop of the current flowing in the second direction over the power transistor and over the second sense transistor to be the same by the second control circuit, and (7) measuring a feedback current of the voltage drop regulation of the current flowing in the second direction by the analog-to digital converter.

In accordance with the objects of this invention a method for sensing bidirectional currents charging and discharging one or more batteries without requiring an external sense resistor has been achieved. The method invented comprises, firstly, the steps of: (1) providing one or more batteries to be charged and discharged, a power transistor, a charge sense transistor, a discharge sense transistor, a regulated cascode circuit for a charge current, a regulated cascode circuit for a discharge current, and an analog-to-digital converter (ADC), (2) mirroring to the charge sense transistor a small fraction of the charge current flowing through the power transistor, and (3) regulating a voltage drop of the charge current over the power transistor and over the charge sense transistor to be the same by the regulated cascode for the charge current, and (4) measuring a feedback current of the voltage drop regulation of the charge current by the analog-to digital converter. The next steps of the method invented are: (5) mirroring to the discharge sense transistor a small fraction of the discharge current flowing through the power transistor, (6) regulating a voltage drop of the discharge current over the power transistor and over the discharge sense transistor to be the same by the regulated cascode for the discharge current, and (7) measuring a feedback current of the voltage drop regulation of the discharge current by the analog-to digital converter. The last step of the method invented is (8) determining actual charge of the one or more batteries by a difference between integrated charge measurements and integrated discharge measurements.

In accordance with the objects of this invention a circuit for sensing bidirectional currents charging and discharging one or more batteries without requiring an external sense resistor has been achieved. The circuit invented comprises, firstly: an input port for a system voltage, a port for a combined current sink/source, wherein one or more positive terminals of the combined current sink/source is connected to a drain of a power transistor and one or more negative terminals thereof are connected to ground, and a charge control circuit, regulating a voltage drop of a charge current over the power transistor and over a charge sense transistor to be the same. Furthermore the circuit invented comprises a discharge control circuit regulating a voltage drop of a discharge current over the power transistor and over a discharge sense transistor to be the same, said power transistor, having its source connected to a system voltage and its gate connected to a gate of a charge sense transistor and to a gate of a discharge sense transistor, and said charge sense transistor connected between the source of the power transistor and an input of said charge control circuit, wherein a small fraction of the charge current through the power transistor is flowing through the charge sense transistor. Finally the circuit invented comprises said discharge sense transistor connected between the drain of the power transistor and an input of said discharge control circuit, wherein a small fraction of the discharge current through the power transistor is flowing through the discharge sense transistor, a charge/discharge gate control circuit connected to the gate of the charge sense transistor, to the gate of the power transistor, and to the gate of the discharge sense transistor, an analog-to-digital converter converting values of feedback currents of the charge control circuit and the discharge control circuit into digital values, wherein a difference between integrated charge measurements and integrated discharge measurements indicate an actual charge of the one or more batteries.

BRIEF DESCRIPTION OF THE DRAWINGS

In the accompanying drawings forming a material part of this description, there is shown.

DESCRIPTION OF THE PREFERRED EMBODIMENTS

Disclosed are circuits and methods for sensing bidirectionally a current without requiring an external sense resistor and wherein no additional voltage drop is added. In general terms the present invention supports any reverse power supply, as e.g. a current flow from a power supply to a mobile electronic device and a current flow from a mobile electronic device to any electronic accessory.

In a preferred embodiment of the invention fuel gauging of a battery in a battery supplied portable system is performed. It is obvious that other applications of the present invention are possible as well.

Figure 1A:
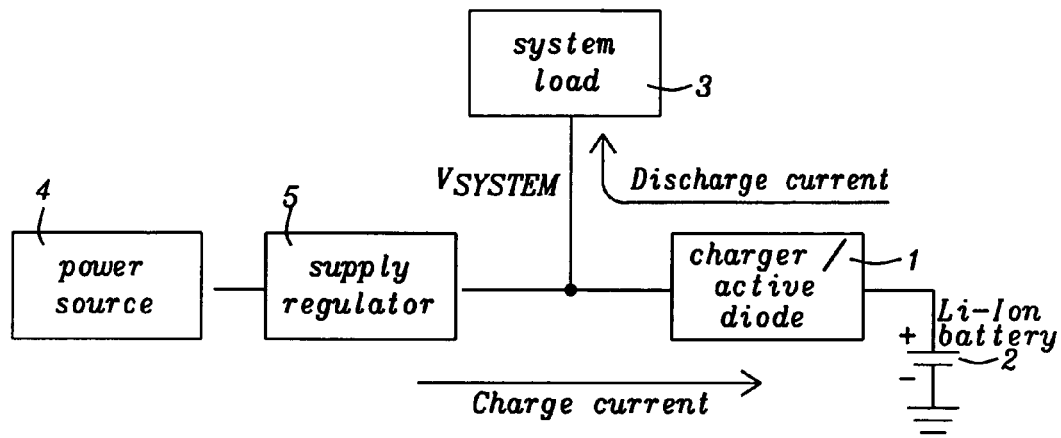
FIG. 1a illustrates a block diagram of a system capable of charging a battery and supply system load by discharging a battery.

FIG. 1a illustrates a block diagram of a preferred embodiment of the present invention, namely a system capable of sensing bi-directional currents as e.g. charging a battery and supply system load by discharging a battery. A typical application of this embodiment of the invention is fuel gauging of a battery in a battery supplied portable system. It should be understood that the present invention can be applied for any other applications requiring sensing of bidirectional currents such as reverse power supply, etc.

The charger implementation shown in FIG. 1a comprises a charger/active diode 1, which is the key part of the present invention, which can source current e.g. to a battery 2 (i.e. charging) and sink current e.g. from the battery 2 to supply a system load 3 (i.e. discharging). The latter functionality is provided by an active diode circuitry or switch circuitry of the charger/active diode part 1. Furthermore the system of FIG. 1a comprises a power source 4 and a supply regulator 5.

Figure 1B:
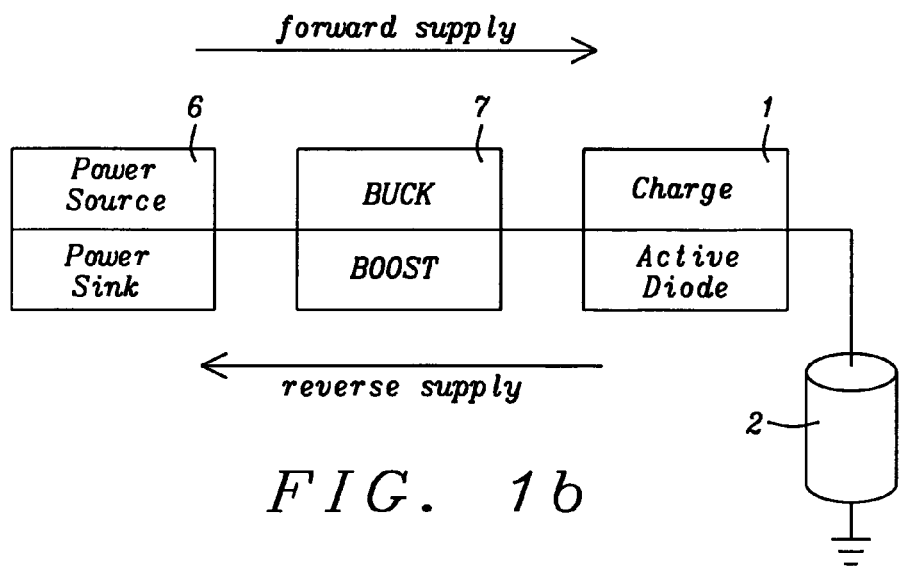
FIG. 1b illustrates a block diagram of a system capable of reverse supply.

It should be noted that the present invention could be applied to any other application requiring sensing of bi-directional currents as e.g. reverse supply as illustrated in FIG. 1b. FIG. 1b illustrates different direction of a current flow, namely forward supply and reverse supply, which are both possible with the present invention. FIG. 1b shows a power source/power sink 6, a supply regulator as e.g. a buck/boost converter 7, the charger/active diode 1, and the battery 2.

Figure 2:
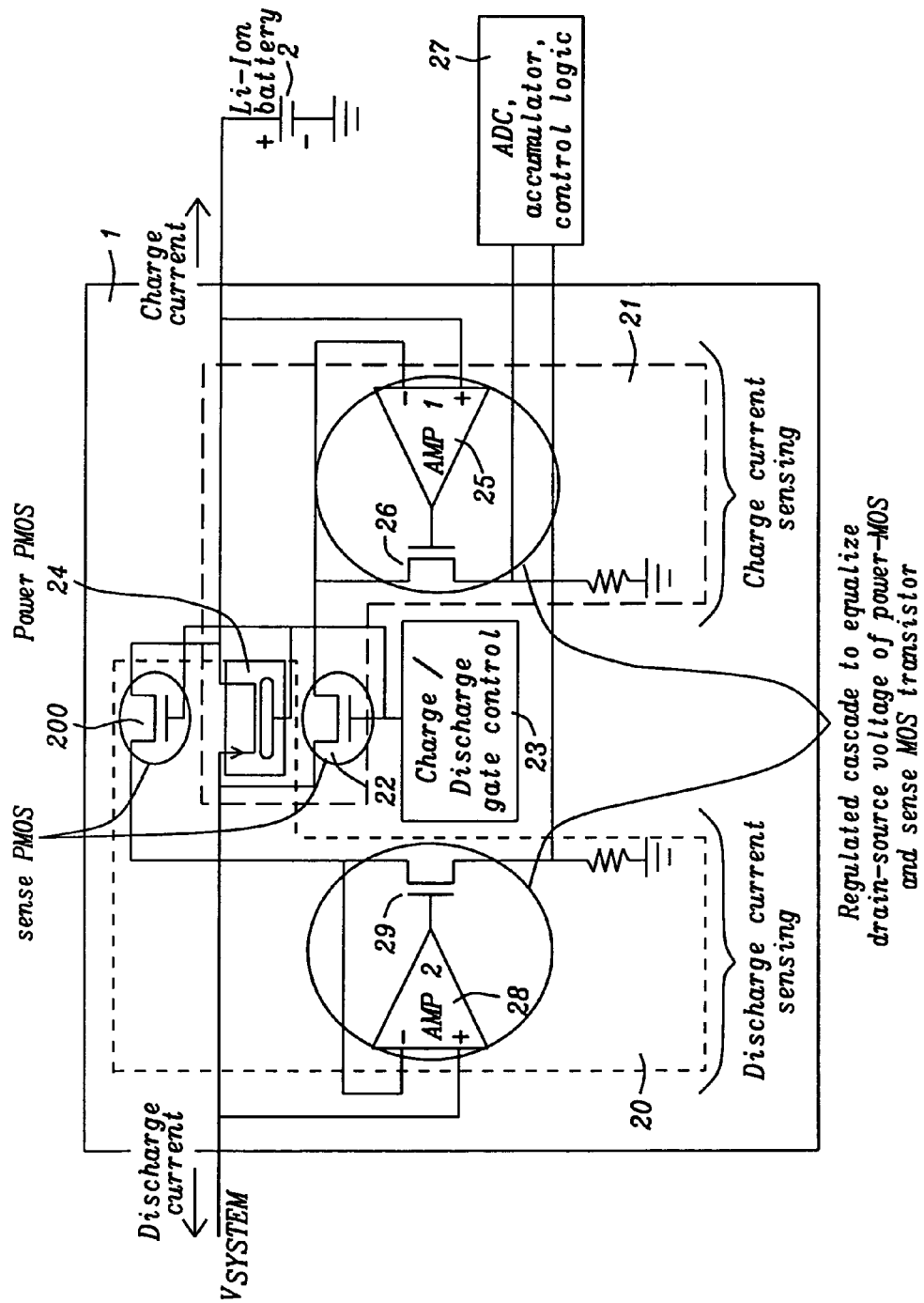
FIG. 2 illustrates an implementation of the bidirectional current sense of the present invention.

FIG. 2 illustrates an implementation of the bidirectional current sense by the charger/active diode 1 of the present invention. The charger/active diode 1 comprises a discharge current sensing part 20 and a charge current sensing part 21. In case of other applications than sensing of battery charge/discharge currents the discharge current corresponds to a current from a current source and the charge current corresponds to a current to a current sink.

The charging process is done with a charge/discharge gate control 23, which is basically a control loop with a fraction of the charge current as feedback signal.

In case the charge/discharge gate control 23 is in charge mode it performs the control of the charging of the battery 2, being adapted to the battery chemistry, i.e. constant current (CC) or constant voltage (CV) charging e.g. LI-Ion batteries. Other types of batteries could be charged as well with the present invention.

In case the charge/discharge gate control 23 is in supply mode it operates as an "active" diode, which is basically operating like a controlled switch having a low voltage drop.

FIG. 2 illustrates a preferred embodiment using PMOS transistors. It should be noted that alternatively the present invention could be also implemented using PNP-devices.

The charge current charges the battery 2; the discharge current supplies the system load 3 shown in FIG. 1. The feedback current is established through a sense PMOS transistor 22, having a size which covers a fraction of the size of the power PMOS 24. The charge current through the power PMOS transistor 24 is mirrored to the charge sense PMOS 22. In the preferred embodiment the relation of size between the sense PMOS transistor 22 and the power PMOS 24 is 1:1000, it is obvious that this relationship is a non-limiting example; other relationships are possible as well. A regulated cascode AMP 1 25 and associated PMOS transistor 26, forces a voltage drop over the power PMOS 24 and sense PMOS 22 to be the same. The feedback current is measured by an analog-to-digital converter (ADC) 27. The integration of these current measurements by the ADC 27 over time is then equal to the total charge put into the battery. It should be noted that in a preferred embodiment of the invention the ADC 27 is integrated with the other components of FIG. 2, except the battery of course, in an integrated circuit (IC).

In regard of discharging a regulated cascode AMP 2 28 and associated PMOS transistor 29, forces a voltage drop over the power PMOS 24 and discharge sense PMOS transistor 200 to be the same. The discharge charge current through the power PMOS transistor 24 is mirrored to the discharge sense PMOS 200. Following the same strategy for discharging the battery as for charging the battery allows now prediction of the remaining charge in the battery.

Additional circuits for compensating offset and mismatch effects can be provided to further improve the precision of the measurement.

Figure 3:
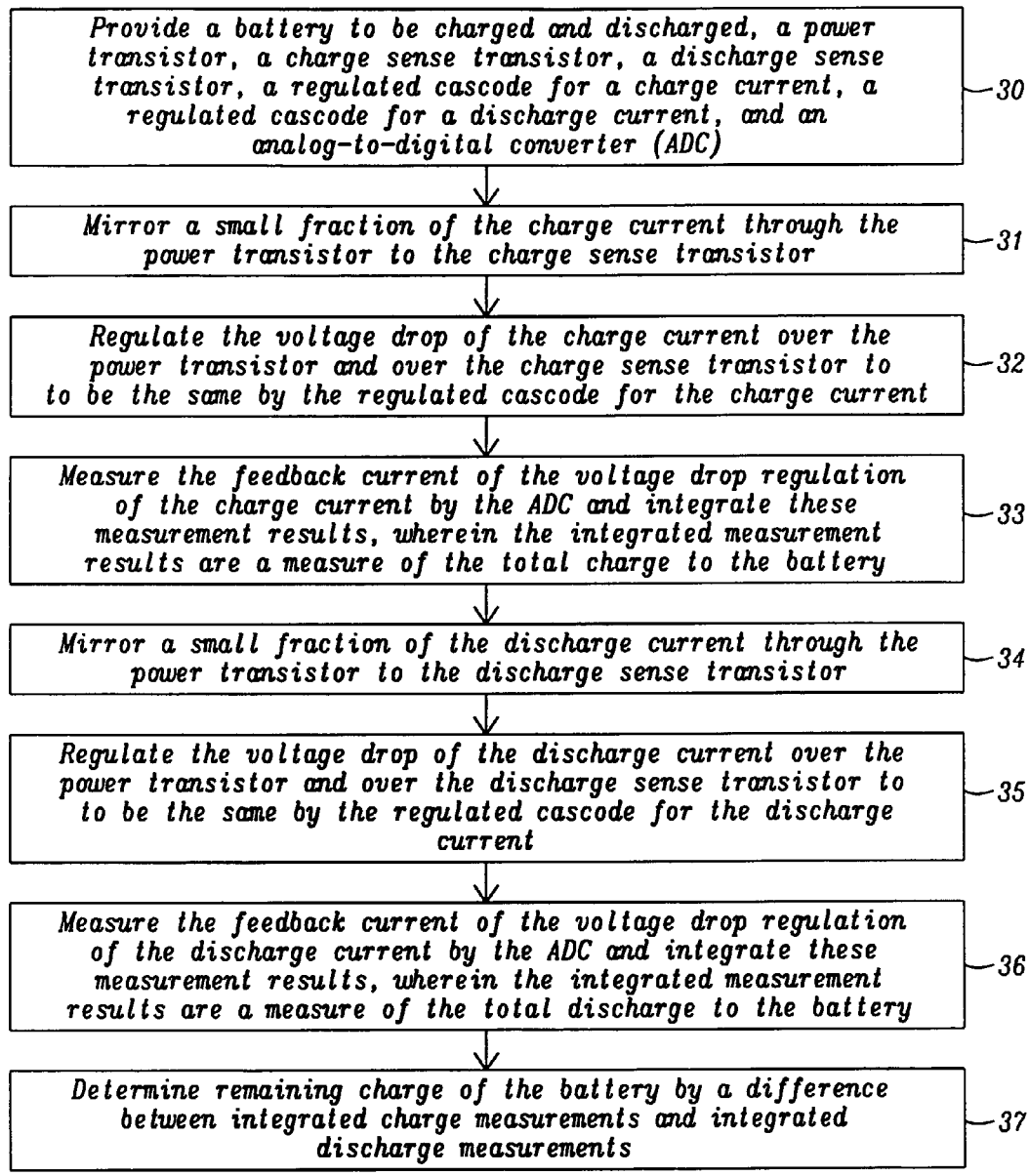
FIG. 3 illustrates a flowchart of a method invented for sensing a bidirectional current into and out of a battery without requiring an external resistor.

FIG. 3 illustrates a flowchart of a method invented for sensing a bidirectional current into and out of a battery without requiring an external resistor. It should be understood that the invention is not limited to sensing a charge/discharge current into and out of a battery; the invention can be applied to bidirectionally sensing currents to and from any current sink/source.

A first step 30 describes the provision of a battery to be charged and discharged, a power transistor, a charge sense transistor, a discharge sense transistor, a regulated cascode for a charge current, a regulated cascode for a discharge current, and an analog-to-digital converter (ADC). Alternatively other control circuits than regulated cascodes could be provided.

A next step 31 illustrates mirroring a small fraction of the charge current through the power transistor to the charge sense transistor. Step 32 describes regulating the voltage drop of the charge current over the power transistor and over the charge sense transistor to be the same by the regulated cascode for the charge current. Step 33 illustrates measuring the feedback current of the voltage drop regulation of the charge current by the ADC and integrate these measurement results, wherein the integrated measurement results are a measure of the total charge to the battery.

Step 34 discloses mirroring a small fraction of the discharge current through the power transistor to the discharge sense transistor. Step 35 illustrates regulating the voltage drop of the discharge current over the power transistor and over the discharge sense transistor to be the same by the regulated cascode for the discharge current. Step 36 describes measuring the feedback current of the voltage drop regulation of the discharge current by the ADC and integrate these measurement results, wherein the integrated measurement results are a measure of the total discharge to the battery.

The last step 37 illustrates determining remaining charge of the battery by a difference between integrated charge measurements and integrated discharge measurements.

In summary, it should be noted that a bidirectional current sense has been achieved without requiring an external resistor, i.e. all components of the current sense circuit can be integrated in an integrated circuit.

For example the invention can be used for a simple and low cost fuel gauging applications of one or more batteries, other applications requiring bidirectional current sensing are possible as well.

While the invention has been particularly shown and described with reference to the preferred embodiments thereof, it will be understood by those skilled in the art that various changes in form and details may be made without departing from the spirit and scope of the invention.

What is claimed is:

1. A method for sensing a bidirectional current without requiring an external sense resistor, comprising the following steps:
    (1) providing of a power transistor, a first sense transistor, a second sense transistor, a first control circuit, a second control circuit, and an analog-to-digital converter (ADC);
    (2) mirroring to the first sense transistor a small fraction of a current to be sensed flowing in a first direction through the power transistor;
    (3) regulating a voltage drop of the current flowing in the first direction over the power transistor and over the first sense transistor to be the same by the first control circuit;
    (4) measuring a feedback current of the voltage drop regulation of the current flowing in the first direction by the analog-to digital converter;
    (5) mirroring to the second sense transistor a small fraction of a current to be sensed flowing in a second direction through the power transistor;
    (6) regulating a voltage drop of the current flowing in the second direction over the power transistor and over the second sense transistor to be the same by the second control circuit; and
    (7) measuring a feedback current of the voltage drop regulation of the current flowing in the second direction by the analog-to digital converter.

2. The method of claim 1 wherein all components provided are integrated in an integrated circuit.

3. The method of claim 1 wherein said power transistor and said sense transistors are all PMOS transistors.

4. The method of claim 1 wherein each of said first and second control circuits comprises a regulated cascode of a differential amplifier and an associated transistor wherein each of the differential amplifiers controls the gate of its associated transistor wherein the correspondent feedback current of the voltage drop regulation is flowing through each of the associated transistor.

5. The method of claim 4 wherein the associated transistors are PMOS transistors.

6. The method of claim 1 wherein said small fraction is in the order magnitude of 1/1000.

7. The method of claim 1 wherein the method is applied for fuel gauging of one or more batteries.

8. A method for sensing bidirectional currents charging and discharging one or more batteries without requiring an external sense resistor, comprising the following steps:
    (1) providing one or more batteries to be charged and discharged, a power transistor, a charge sense transistor, a discharge sense transistor, a regulated cascode circuit for a charge current, a regulated cascode circuit for a discharge current, and an analog-to-digital converter (ADC);
    (2) mirroring to the charge sense transistor a small fraction of the charge current flowing through the power transistor;
    (3) regulating a voltage drop of the charge current over the power transistor and over the charge sense transistor to be the same by the regulated cascode for the charge current;
    (4) measuring a feedback current of the voltage drop regulation of the charge current by the analog-to digital converter;

(5) mirroring to the discharge sense transistor a small fraction of the discharge current flowing through the power transistor;

(6) regulating a voltage drop of the discharge current over the power transistor and over the discharge sense transistor to be the same by the regulated cascode for the discharge current;

(7) measuring a feedback current of the voltage drop regulation of the discharge current by the analog-to digital converter; and (8) determining actual charge of the one or more batteries by a difference between integrated charge measurements and integrated discharge measurements.

9. The method of claim 8 wherein all components provided are integrated in an integrated circuit.

10. The method of claim 8 wherein said power transistor and said sense resistors are all PMOS transistors.

11. The method of claim 8 wherein each of said regulated cascodes comprises a differential amplifier and an associated transistor wherein each of the differential amplifiers controls the gate of its associated transistor wherein the correspondent feedback current of the voltage drop regulation is flowing through each of the associated transistor.

12. The method of claim 11 wherein the associated transistors are PMOS transistors.

13. The method of claim 8 wherein said small fraction is in the order magnitude of 1/1000.

14. The method of claim 8 wherein the method is applied for reverse power supply.

15. A circuit for sensing bidirectional currents charging and discharging one or more batteries without requiring an external sense resistor, comprising:

an input port for a system voltage;

a port for a combined current sink/source, wherein one or more positive terminals of the combined current sink/source is connected to a drain of a power transistor and one or more negative terminals thereof are connected to ground;

a charge control circuit, capable of regulating a voltage drop of a charge current over the power transistor and over a charge sense transistor to be the same;

a discharge control circuit capable of regulating a voltage drop of a discharge current over the power transistor and over a discharge sense transistor to be the same;

said power transistor, having its source connected to a system voltage and its gate connected to a gate of a charge sense transistor and to a gate of a discharge sense transistor;

said charge sense transistor connected between the source of the power transistor and an input of said charge control circuit, capable of having a small fraction of the charge current through the power transistor flowing through the charge sense transistor;

said discharge sense transistor connected between the drain of the power transistor and an input of said discharge control circuit, capable of having a small fraction of the discharge current through the power transistor flowing through the discharge sense transistor; and a charge/discharge gate control circuit connected to the gate of the charge sense transistor, to the gate of the power transistor, and to the gate of the discharge sense transistor.

16. The circuit of claim 15 wherein said charge control circuit comprises a differential amplifier, wherein a positive input of the differential amplifier is connected to the drain of the power transistor, a negative input of the differential amplifier is connected to the drain of the charge sense transistor, and an output of the differential amplifier is connected to a gate of a first associated transistor;

said first associated transistor, wherein a drain of the first associated transistor is connected to a first input of an analog-to-digital converter and to a first terminal of a first resistor and the source of the first associated transistor is connected to a drain of the charge sense transistor; and said first resistor having its second terminal connected to ground.

17. The circuit of claim 16 wherein the associated transistors is a PMOS transistors.

18. The circuit of claim 15 wherein said charge discharge control circuit comprises a differential amplifier, wherein a positive input of the differential amplifier is connected to the system voltage, a negative input of the differential amplifier is connected to the drain of the discharge sense transistor, and an output of the differential amplifier is connected to a gate of a associated transistor;

said second transistor, wherein a drain of the second transistor is connected to a second input of an analog-to-digital converter and to a first terminal of a resistor and the source of the associated transistor is connected to the drain of the discharge sense transistor; and said resistor having its second terminal connected to ground.

19. The circuit of claim 18 wherein the associated transistors are PMOS transistors.

20. The circuit of claim 15 wherein said power transistor and said sense transistors are all PMOS transistors.

21. The circuit of claim 15 wherein said small fraction is in the order magnitude of 1/1000.

22. The circuit of claim 15 wherein the circuit is applied for reverse power supplying.

23. The circuit of claim 15 wherein the circuit is applied for sensing bidirectional currents charging and discharging one or more batteries.

24. The circuit of claim 23 wherein said circuit applied for sensing bidirectional currents charging and discharging one or more batteries comprises an analog-to-digital converter converting values of feedback currents of the charge control circuit and the discharge control circuit into digital values, wherein a difference between integrated charge measurements and integrated discharge measurements indicate an actual charge of the one or more batteries.

* * * * *